(12) United States Patent
Lee et al.

(10) Patent No.: US 7,495,315 B2
(45) Date of Patent: Feb. 24, 2009

(54) METHOD AND APPARATUS OF FABRICATING A SEMICONDUCTOR DEVICE BY BACK GRINDING AND DICING

(75) Inventors: Sang-Yeop Lee, Cheonan-si (KR); Cheul-Joong Youn, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/987,844

(22) Filed: Dec. 5, 2007

(65) Prior Publication Data

US 2008/0086858 A1      Apr. 17, 2008

Related U.S. Application Data

(62) Division of application No. 10/984,843, filed on Nov. 10, 2004, now Pat. No. 7,323,397.

(30) Foreign Application Priority Data

Mar. 3, 2004    (KR) ............................... 2004-14248

(51) Int. Cl.
*H01L 23/544* (2006.01)
*H01L 21/768* (2006.01)
*H01L 21/78* (2006.01)
*H01L 21/50* (2006.01)
*H01L 21/48* (2006.01)
*H01L 21/44* (2006.01)
*H01L 21/46* (2006.01)

(52) U.S. Cl. .............................. 257/620; 257/E21.596; 257/E21.599; 438/114; 438/465; 438/113; 438/458; 438/464; 438/462; 438/460

(58) Field of Classification Search ................ 257/620, 257/E21.596, E21.599; 438/113, 114, 458, 438/460, 462, 464, 465
See application file for complete search history.

(56) References Cited

U.S. PATENT DOCUMENTS

| | | | |
|---|---|---|---|
| 6,338,980 B1 | 1/2002 | Satoh | |
| 6,448,151 B2 | 9/2002 | Tateishi | |
| 6,716,723 B2 | 4/2004 | Nepomuceno et al. | |
| 2002/0048904 A1 | 4/2002 | Oka | |

FOREIGN PATENT DOCUMENTS

| | | |
|---|---|---|
| JP | 2000-208446 | 7/2000 |
| JP | 2000-306875 | 11/2000 |
| KR | 2003-0091648 | 12/2003 |

*Primary Examiner*—Luan C Thai
(74) *Attorney, Agent, or Firm*—Harness Dickey & Pierce, P.L.C.

(57) ABSTRACT

A method and apparatus of fabricating a semiconductor device by back grinding and dicing is disclosed. The method may include at least adhering a protection tape for back grinding on a front surface of a semiconductor wafer, back grinding a rear surface of the semiconductor wafer while the protection tape faces downward, loading the semiconductor wafer to dicing equipment when the front surface having the protection tape faces downward, detecting a dicing position formed on the front surface of the semiconductor wafer, and dicing the semiconductor wafer with the protection tape adhering thereon into individual semiconductor chips in accordance with the detected dicing position. The dicing equipment may have a transparent aligning part for aligning the semiconductor wafer and a chuck part for supporting the semiconductor wafer.

5 Claims, 4 Drawing Sheets

METHOD AND APPARATUS OF FABRICATING A SEMICONDUCTOR DEVICE BY BACK GRINDING AND DICING

PRIORITY STATEMENT

This is a divisional application of U.S. application Ser. No. 10/984,843 filed Nov. 10, 2004, now U.S. Pat. No. 7,323,397 now allowed, which claims priority under 35 U.S.C. § 119 to Korean Patent Application No. 2004-14248, filed on Mar. 3, 2004, in the Korean Intellectual Property Office, the entire contents of each of which is hereby incorporated by reference.

BACKGROUND OF THE INVENTION

1. Field of the Invention

The present invention relates to a method and apparatus of fabricating a semiconductor device, and more particularly to a method and apparatus of fabricating a semiconductor device by back grinding and dicing.

2. Description of the Related Art

In general, a plurality of semiconductor chips may be formed on a semiconductor wafer, which may be separated into individual semiconductor chips by a back grinding process and a dicing process. Back grinding may be a process of grinding a rear surface of the semiconductor wafer, and dicing may be a process of cutting the semiconductor wafer into individual semiconductor chips using, for example, a blade.

FIGS. 1 through 6 are sectional views showing a conventional method of fabricating a semiconductor device including back grinding and dicing.

Referring to FIG. 1, a semiconductor wafer 1 formed with a circuit pattern 3 is shown. The semiconductor wafer 1 may be composed of, for example, silicon. A front surface of the semiconductor wafer 1 formed with the circuit pattern 3 may have a plurality of semiconductor chips. A protection tape 5 for back grinding may adhere on the front surface of the semiconductor wafer 1.

Referring to FIG. 2, the semiconductor wafer 1 with the protection tape 5 thereon may be upside down, thereby placing a rear surface 1a of the semiconductor wafer 1 to face upward. The rear surface 1a of the semiconductor wafer 1 may be then grinded using for example, a grinding tool 6 which results in a relatively thin semiconductor wafer 1.

Referring to FIGS. 3 and 4, the rear surface 1a of the thinned semiconductor wafer may have a tape 7 for dicing adhering thereon. In other words, the rear surface 1a of the semiconductor wafer 1 with the circuit pattern 3 and the protection tape 5 on the front surface thereof may be adhered to the tape 7 for dicing.

Subsequently, as shown in FIG. 4, the protection tape 5 for back grinding adhering on the front surface of the thinned semiconductor wafer 1 may be removed.

Referring to FIG. 5, by removing the protection tape 5 for back grinding, the surface of the semiconductor wafer 1 may be exposed. Using a light source 8 and a camera 9, a position of dicing on the surface of the semiconductor wafer 1 may be detected.

Referring to FIG. 6, a blade 11 of dicing equipment may be used for dicing (cutting) the semiconductor wafer, and thus obtaining individual semiconductor chips 13.

However, the performed dicing when fabricating the conventional semiconductor device typically generates powders due to the cutting procedure of the semiconductor wafer 1. The silicon powders may be washed off by applying deionized water for cleaning and cooling the dicing equipment. However, applying deionized water may only partially remove the silicon powders. For example, in a conventional semiconductor device for image processing, such as a charge coupled device (CCD), the remain silicon power left over on the semiconductor chip 13 may adversely affect the processing of the semiconductor chip 13.

Furthermore, the conventional method of fabricating the semiconductor device may require tape replacement and removal of the protection tape for back grinding, which increases fabricating cost. Further, when replacing the tape, a relatively thin semiconductor wafer 1 may be more likely to split or crack.

SUMMARY OF THE INVENTION

In an exemplary embodiment, a method of fabricating a semiconductor device may include at least adhering a protection tape for back grinding on a front surface of a semiconductor wafer, back grinding a rear surface of the semiconductor wafer while the protection tape faces downward, loading the semiconductor wafer to dicing equipment when the front surface having the protection tape faces downward, detecting a dicing position formed on the front surface of the semiconductor wafer, and dicing the semiconductor wafer with the protection tape adhering thereon into individual semiconductor chips in accordance with the detected dicing position. The dicing equipment may have a transparent aligning part for aligning the semiconductor wafer and a chuck part for supporting the semiconductor wafer.

In another exemplary embodiment, the protection tape used for both the back grinding and the dicing may be transparent.

In another exemplary embodiment, detecting the dicing position may be performed by the transparent aligning part and the transparent protection tape.

In another exemplary embodiment, detecting the dicing position may be performed using an alignment camera installed on a lower side of the semiconductor wafer.

In another exemplary embodiment, dicing the semiconductor wafer may be performed at the rear surface of the semiconductor wafer.

In yet another exemplary embodiment, after the dicing the semiconductor wafer, the dicing procedure may include reducing an adhesive force between the semiconductor wafer and the protection tape by emitting radiation towards the front surface of the semiconductor wafer with the protection tape adhering thereon.

In yet another exemplary embodiment, after the dicing the semiconductor wafer, the dicing procedure may include die attaching by separating individual semiconductor chips while the front surface of the semiconductor wafer with the protection tape adhering thereon faces downward.

In yet another exemplary embodiment, after dicing the semiconductor wafer, the dicing procedure may include reducing an adhesive force of the protection tape by emitting radiation towards the front surface of the semiconductor wafer with the protection tape adhering thereon, and die attaching by separating individual semiconductor chips while the front surface of the semiconductor wafer with the protection tape adhering thereon faces downward.

In yet another exemplary embodiment, after the dicing the semiconductor wafer, the dicing procedure may include loading the semiconductor wafer to a wafer frame having an adhesive tape so that a rear surface of the semiconductor wafer faces downward, and removing the protection tape adhering on the front surface of the semiconductor wafer.

In yet another exemplary embodiment, after the dicing the semiconductor wafer, the dicing procedure may include reducing an adhesive force of the protection tape by emitting radiation towards the front surface of the semiconductor wafer with the protection tape adhering thereon, loading the semiconductor wafer to a wafer frame having an adhesive tape so that a rear surface of the semiconductor wafer faces downward, and removing the protection tape adhering on the front surface of the semiconductor wafer. In other exemplary embodiments, the method of fabricating a semiconductor device may include at least adhering a protection tape on an active surface of a semiconductor wafer so as to back grind a non-active surface of the semiconductor wafer, detecting a dicing position on the active surface of the semiconductor wafer while the protection tape faces downward, and dicing the semiconductor wafer with the protection tape adhering thereon into individual semiconductor chips in accordance with the detected dicing position.

In another exemplary embodiment, the invention may provide a semiconductor device with at least a semiconductor wafer having an active surface and a non-active surface, and a tape for protecting and dicing adhered on the active surface of the semiconductor wafer so as to back grind a non-active surface of the semiconductor wafer, wherein the tape faces downward during back grinding.

In yet another exemplary embodiment, the tape may be transparent.

In yet another exemplary embodiment, the active surface may include a circuit pattern.

In yet another exemplary embodiment, the active surface of the semiconductor wafer may include a dicing position.

In yet another exemplary embodiment, the dicing position may be detected by an alignment camera.

In yet another exemplary embodiment, the non-active surface of the semiconductor wafer may be diced by dicing equipment.

In yet another exemplary embodiment, the dicing equipment may include a transparent aligning part for aligning the semiconductor wafer and a chuck part for supporting the semiconductor wafer.

In another exemplary embodiment, the invention may include an apparatus for fabricating a semiconductor device having at least a detector for detecting a dicing position formed on an active surface of a semiconductor wafer while a protection tape faces downward, and dicing equipment for dicing the semiconductor wafer into individual semiconductor chips in accordance with the detected dicing position, the dicing equipment includes a transparent aligning part for aligning the semiconductor wafer and a chuck part for supporting the semiconductor wafer.

In the exemplary embodiments, the present invention provides a method of fabricating a semiconductor device capable of preventing silicon powders from remaining on a semiconductor chip when dicing. Further, because the protection tape for back grinding may be also used in dicing, the produced silicon powders when dicing will not adversely affect the semiconductor chip.

In other exemplary embodiments, the present invention reduces or eliminates tape replacement for dicing and/or removes the protection tape during back grinding.

BRIEF DESCRIPTION OF THE DRAWINGS

Exemplary embodiments of the present invention will be readily understood with reference to the following detailed description thereof provided in conjunction with the attached drawings in which.

DETAILED DESCRIPTION OF EXEMPLARY EMBODIMENT

Exemplary embodiments will now be described more fully with reference to the accompanying drawings. The invention may, however, be embodied in many different forms and should not be construed as being limited to the embodiments set forth herein; rather these embodiments are provided so that this disclosure will be thorough and complete, and will fully convey the concept of the invention to those skilled in the art.

It should be noted that these Figures are intended to illustrate the general characteristics of methods and devices of exemplary embodiments of this invention, for the purpose of the description of such exemplary embodiments herein. These drawings are not, however, to scale and may not precisely reflect the characteristics of any given embodiment, and should not be interpreted as defining or limiting the range of values or properties of exemplary embodiments within the scope of this invention.

In particular, the relative thicknesses and positioning of layers or regions may be reduced or exaggerated for clarity. Further, a layer is considered as being formed "on" another layer or a substrate when formed either directly on the referenced layer or the substrate or formed on other layers or patterns overlaying the referenced layer. It will further be understood that when a layer is referred to as being "on" or "formed over" another layer or substrate, the layer may be directly on the other layer or substrate, or intervening layer(s) may also be present.

FIGS. 7 through 13 are sectional views illustrating an exemplary method of fabricating a semiconductor device according to the present invention.

Figure 1:
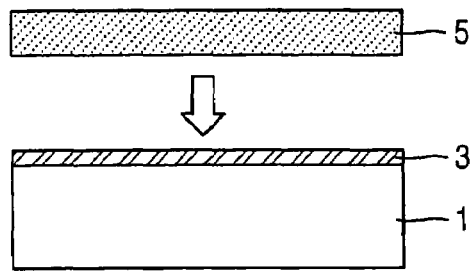
FIGS. 1 through 6 are sectional views illustrating a conventional method of fabricating a semiconductor device including back grinding and dicing.
Figure 2:
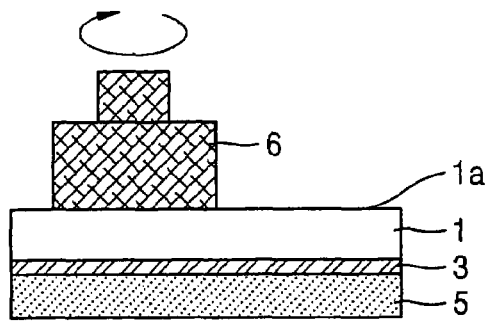
Figure 3:
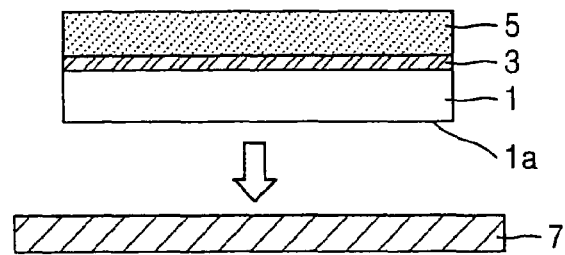
Figure 4:
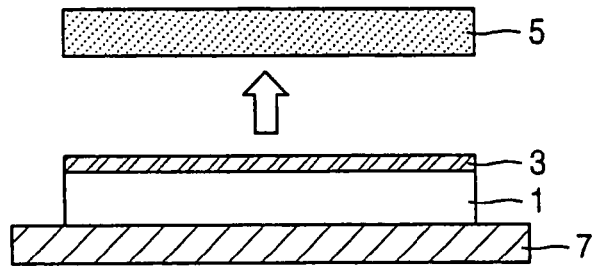
Figure 5:
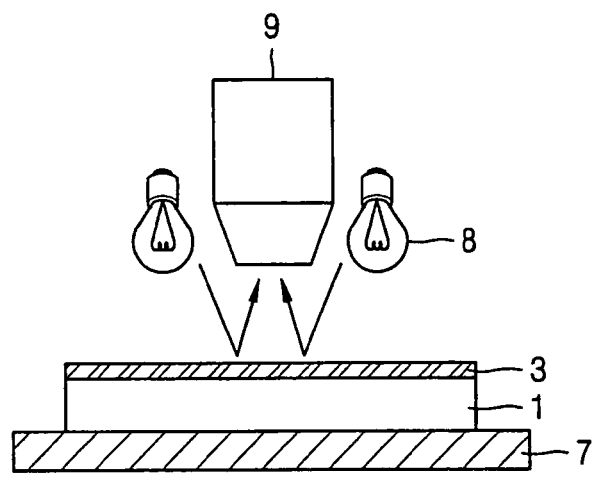
Figure 6:
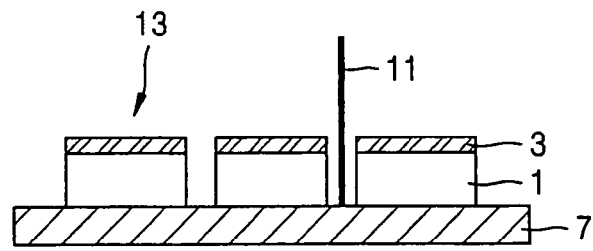
Figure 7:
FIG. 7 is a sectional view of an exemplary embodiment of a semiconductor device according to the present invention.

Referring to FIG. 7, a protection tape 103 for back grinding may adhere on a front surface of a semiconductor wafer 101 on which a circuit pattern may be formed. The protection tape 103 may act as a layer for protecting the surface of the semiconductor wafer 10 during back grinding. The protection tape 103 may be nearly transparent to show the circuit pattern or a surface formation of the semiconductor wafer 101. A reference numeral 101a denotes a rear surface of the semiconductor wafer 101.

Figure 8:
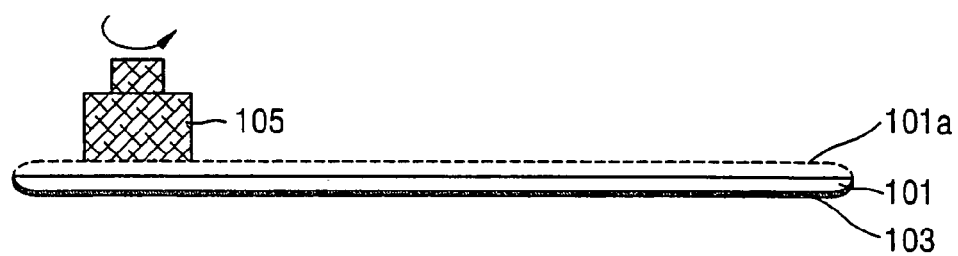
FIG. 8 is a sectional view of an exemplary embodiment of a semiconductor device with grinding equipment according to the present invention.

Referring to FIG. 8, the semiconductor wafer 101 having the protection tape 103 for back grinding may be positioned upside down. Accordingly, using grinding equipment 105 when the protection tape 103 is faced downward, the rear surface 101a of the semiconductor wafer 101 may be grinded to an appropriate thickness. As an exemplary embodiment, a thickness of the semiconductor wafer 101 may be about 700 μm before grinding and may be about 15 μm after grinding.

Figure 9:
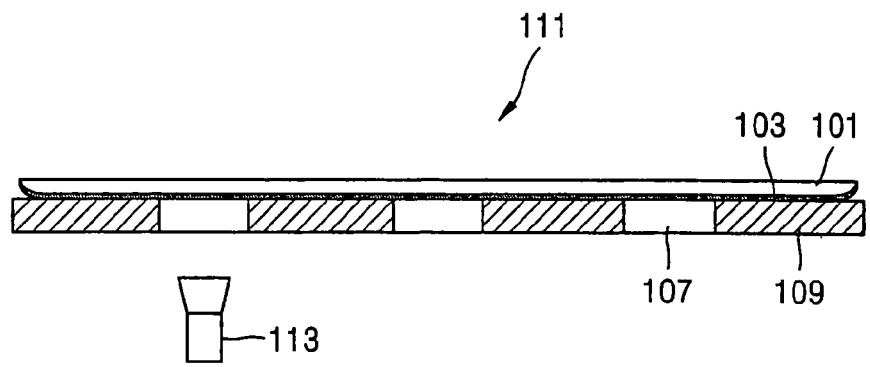
FIG. 9 is a sectional view of an exemplary embodiment of a semiconductor device loaded on dicing equipment according to the present invention.

Referring to FIG. 9, the semiconductor wafer 101 may be loaded on dicing equipment 111 that may have a transparent aligning part 107 and a chuck part 109. The transparent aligning part 107 may be capable of aligning the semiconductor wafer 101 and the chuck part 109 may be capable of supporting the semiconductor wafer 101. When loading the semiconductor wafer 101, the front surface of the semiconductor wafer 101 with the protection tape 103 thereon may face downward. In other words, the semiconductor wafer 101 may be loaded on the dicing equipment 111 so that the protection tape 103 for back grinding need not be removed.

Further, the dicing equipment 111 may detect a dicing position because the chuck part 109 may support the semiconductor wafer 101 and the transparent aligning part 107 may show the front surface of the semiconductor 101. Thus, the dicing process may be performed so that the protection tape adhering on the front surface of the semiconductor wafer 101 face downward.

The dicing equipment 111 may also include an alignment camera 113. It should be appreciated that one of ordinary skilled in the art may use other devices that captures images besides a camera. The alignment camera 113 may be installed on a bottom side of the semiconductor wafer 101 which may be used for detecting the dicing position formed on the front surface of the semiconductor wafer 101. The dicing position may be detected in such a manner that light may be emitted from a light source included in the alignment camera 113 via the transparent aligning part 107 and the transparent protection tape 103. The emitted light may be reflected from the dicing position provided on the front surface of the semiconductor wafer 101. Thus, the reflected light may be perceived by the alignment camera 113, thereby detecting the dicing position.

Figure 10:
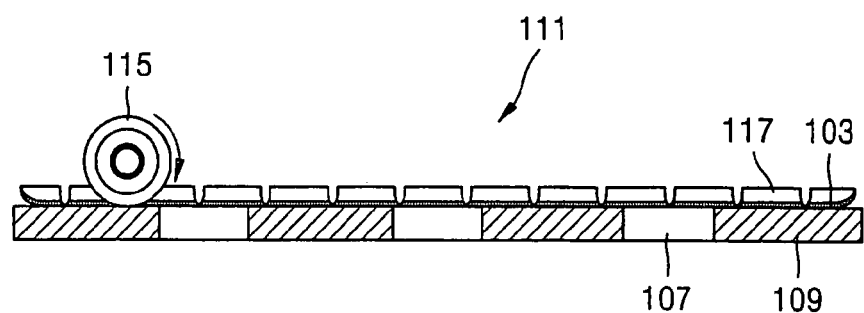
FIG. 10 is a sectional view of another exemplary embodiment of a semiconductor device with dicing equipment according to the present invention.

Referring to FIG. 10, the semiconductor wafer 101 may be diced into individual semiconductor chips 117 using, for example, a blade 115 of the dicing equipment 111 in accordance with the detected dicing positions when the protection tape 103 for back grinding is adhered. That is, the blade 115 of the dicing equipment 111 may dice from the rear surface side of the semiconductor wafer 101 into individual semiconductor chips 117 while using the protection tape 103 for back grinding. When dicing, the blade 115 may move in the X-axis and the Y-axis directions on the semiconductor wafer 101.

Figure 11:
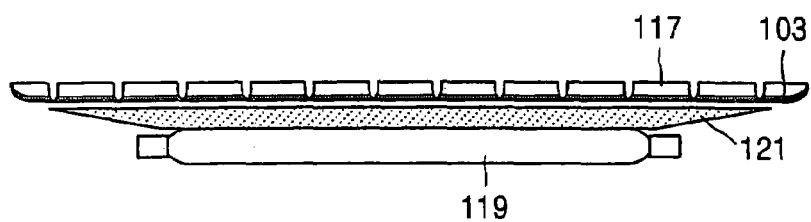
FIG. 11 is a sectional view of an exemplary embodiment of a semiconductor device using ultraviolet ray emitting equipment according to the present invention.

Referring to FIG. 11, the protection tape 103 may be applicable to a tape hardened process by applying radiation, for example, ultraviolet rays. As an exemplary embodiment, the ultraviolet rays may be generated by ultraviolet ray emitting equipment 119. However, it should be appreciated that other devices may be used to radiate the protection tape 103 beside ultraviolet ray emitting equipment. The ultraviolet rays 121 may be radiated toward the front surface of the semiconductor wafer 101 with the protection tape 103 thereon. When the ultraviolet rays 121 are radiated onto the protection tape 103, an adhesive force between the semiconductor wafer 101 and the protection tape 103 may be reduced. In an alternative embodiment, the radiation may be omitted.

Figure 12:
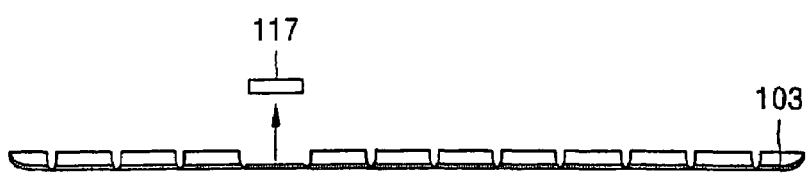
FIGS. 12 and 13 are sectional views of an exemplary embodiment of a die attach process with individually separated semiconductor devices according to the present invention.

Referring to FIG. 12, a semiconductor wafer 101 with a protection tape 103 facing downward is shown. Further, as shown in FIG. 12, a die attaching process with individual semiconductor chips 117 are separated when the front surface of the semiconductor wafer 101 with the protection tape 103 faces downward. In other words, the die attaching process for separating the semiconductor chips may be performed while the diced semiconductors wafer remains unchanged.

Figure 13:
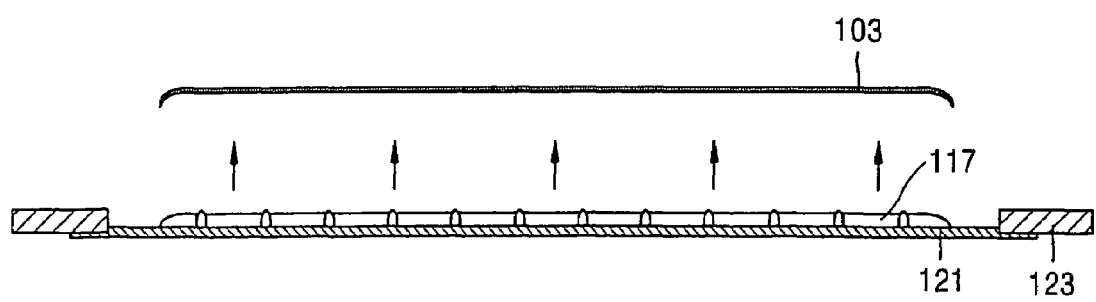

Referring to FIG. 13, the semiconductor wafer 101 with the back-ground rear surface facing downward may be loaded on a wafer frame 123 with an adhesive tape 121. Accordingly, the die attaching process may be performed after the protection tape 103 adhering on the front surface of the semiconductor wafer 101 is removed.

The dicing equipment according to exemplary embodiments of the invention as described above may include at least a chuck part capable of supporting the semiconductor wafer and a transparent aligning part capable of showing the front surface of the semiconductor wafer so as to align the semiconductor wafer. By using such dicing equipment, the dicing position may be detected and the dicing may be performed while the protection tape adhering on the semiconductor wafer faces downward.

In an exemplary embodiment, the surface protection tape for back grinding may be also used when dicing. That is, the rear surface of the semiconductor wafer may be diced while the protection tape for back grinding adheres thereon. In this configuration, silicon powders produced when performing the dicing procedure may have little or no influence on the semiconductor chip because the protection tape for back grinding may be also used in dicing, which may be desirable for a semiconductor device, such as a charge-coupled device (CCD).

Moreover, in the exemplary embodiments, tape replacement of adhering tape for dicing and removal of a protection tape for back grinding need may not be required which may decrease fabrication cost of the semiconductor device. Further, splits or cracks when replacing the tape may be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus for fabricating a semiconductor device, comprising:
    a detector for detecting a dicing position formed on an active surface of a semiconductor wafer while a protection tape faces downward; and
    dicing equipment for dicing the semiconductor wafer into individual semiconductor chips in accordance with the detected dicing position, the dicing equipment includes a transparent aligning part for aligning the semiconductor wafer and a chuck part for supporting the semiconductor wafer.

2. The apparatus according to claim 1, wherein the dicing position is detected on the transparent aligning part and the protection tape.

3. The apparatus according to claim 1, wherein the detector is an alignment camera installed at a lower side of the semiconductor wafer.

4. The apparatus according to claim 1, wherein the dicing equipment further comprises ultraviolet ray emitting equipment for reducing an adhesive force between the semiconductor wafer and the protection tape.

5. The apparatus according to claim 1, wherein the dicing equipment further comprises a die attaching device for separating the individual semiconductor chips while allowing the active surface of the semiconductor wafer with the protection tape adhering thereon to face downward.

* * * * *